CIRCUIT BOARD WIRE TRIMMER

Filed May 31, 1966

INVENTOR
EWING L. SHARP
BY
EDWARD D. O'BRIAN
ATTORNEY

United States Patent Office 3,453,918
Patented July 8, 1969

3,453,918
CIRCUIT BOARD WIRE TRIMMER

Ewing L. Sharp, 1014 W. Burbank Blvd., North Hollywood, Calif.

Filed May 31, 1966, Ser. No. 553,884
Int. Cl. B26d *1/18, 7/00;* B23d *19/00*
U.S. Cl. 83—471 4 Claims

ABSTRACT OF THE DISCLOSURE

This invention is directed to a circuit board wire trimmer, and particularly to a machine adapted to closely and evenly trim component wires extending through a printed circuit board, prior to the soldering thereof. The circuit board wire trimmer of this invention comprises means to position a printed circuit board, and to maintain the printed circuit board and its components in position. It also includes a rotary cutter which is properly positioned with respect to the circuit board for cutting the wires to the proper length. Guidance means is provided for the cutter so that it is movable along the proper path for wire cutting.

BACKGROUND.

Printed circuit boards are well known. They usually comprise a plurality of conductors on one side of the board which conductors were etched out of a copper sheet laminated to the board. Components are normally placed on one side of the board, opposite to the conductors. The component leads extend through openings in the board, which openings are positioned at the conductors. Upon dipping the circuit side of the board into solder, all of the leads are soldered to their conductors in a single operation. However, the leads must be trimmed to a length where they extend just past the face of the conductors before the soldering operation takes place. This has previously been a time consuming manual operation which prevented the use of circuit boards from reaching their full economical potential.

DESCRIPTION

Accordingly, it is an object of this invention to provide a circuit board wire trimmer which rapidly and conveniently trims the protruding leads on a printed circuit board to the desired length, prior to the soldering thereof. It is another object of this invention to provide a full utilitarian circuit board wire trimmer which is adjustable so that it may receive any one of a plurality of different sizes of circuit boards. It is another object of this invention to provide a circuit board wire trimmer which is easy to use, free of maintenance and of long life so that it improves the economic advantage of the use of printed circuit boards. Other objects and advantages of this invention will become apparent from a study of the following portion of this specification, the attached claims and the drawings.

Figures 1, 2, 3:
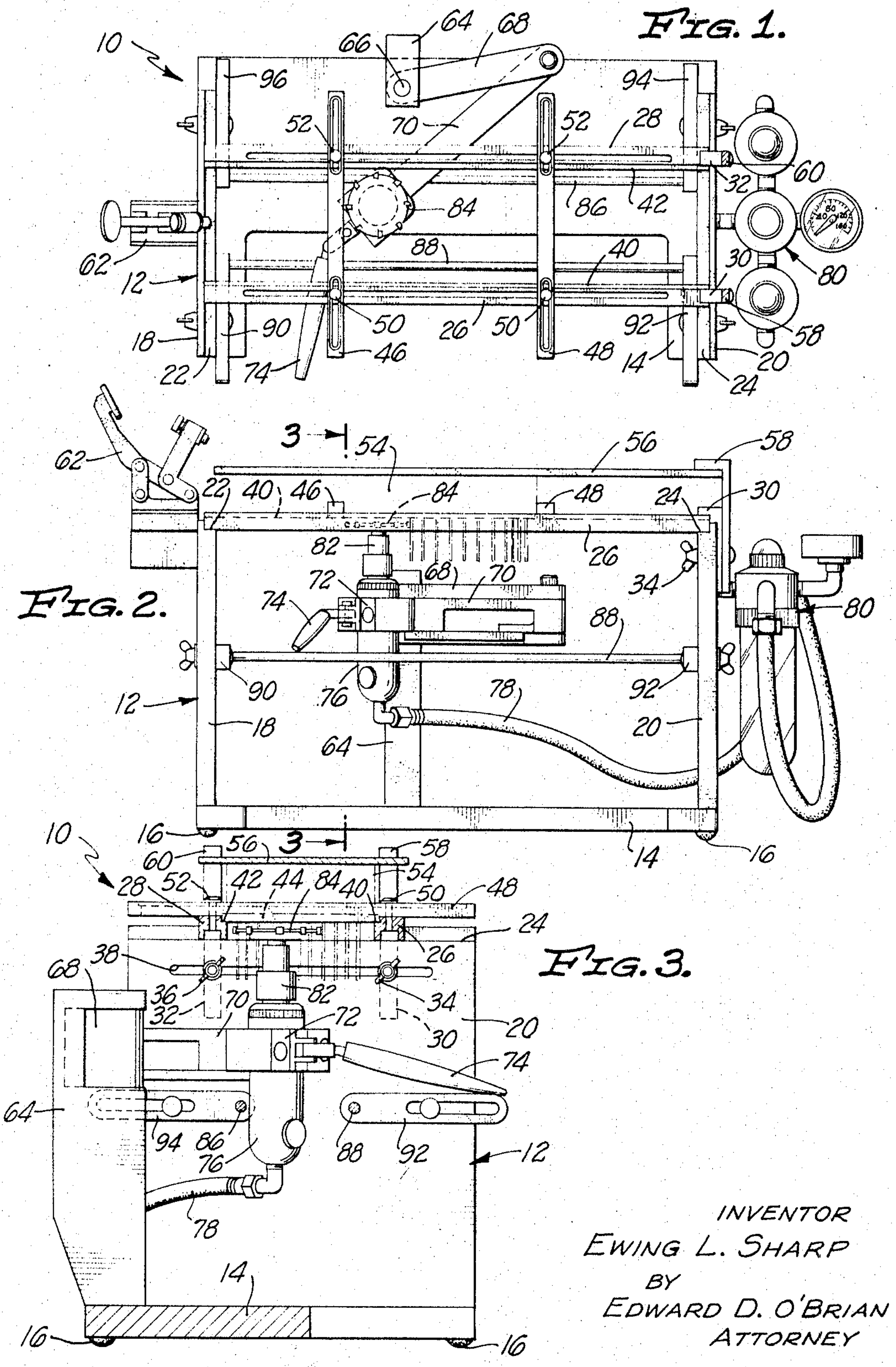
FIG. 1 is a top plan view of the circuit board wire trimmer of this invention.
FIG. 2 is a side elevational view thereof.
FIG. 3 is an enlarged section taken generally along the line 3—3 of FIG. 2.

Referring now to the drawings, the circuit board wire trimmer of this invention is generally indicated at 10. The circuit board wire trimmer 10 comprises frame 12 which has base plate 14. Base plate 14 may have feet 16 for supporting the trimmer 10 upon a table or the like. End plates 18 and 20 are secured to the base plate 14 and extend upwardly therefrom. The tops of end plates 18 and 20 are respectively finished with bearing surfaces 22 and 24 which are recessed below the tops of the end plates to provide stop shoulders on the end plates. Longitudinal bars 26 and 28 are positioned upon bearing surfaces 22 and 24. They are maintained in place by means of clamps 30 and 32 which are L shaped and are secured to the outer face of end plate 20 by means of clamp screws 34 and 36. Clamp screws 34 and 36 preferably pass through slot 38 so that the clamps and bars 26 and 28 may be adjusted from front to back along the bearing surfaces 22 and 24 so as to make adjustable the distance between them for accommodation of printed circuit boards of different widths. Each of the longitudinal bars 26 and 28 has a step at the interior edge thereof. These steps are shown at 40 and 42 and provide a place to rest a circuit board thereon. Circuit board 44 is shown in dot-dash lines to illustrate its position between these bars. To prevent endwise motion of the circuit board 44, cross bars 46 and 48 are clamped on the top of the longitudinal bars. This clamping is accomplished by means of slots in both the longitudinal bars and cross bars so that bolts, two of which are shown at 50 and 52, can be passed therethrough. The cross bars are preferably cut so that they extend downwardly to the level of steps 40 and 42 for endwise engagement by circuit board 44. By this arrangement of slots and bolts any circuit board can be accommodated in the trimmer 10 of this invention between a reasonable minimum and a reasonable maximum. The longitudinal and cross bars laterally hold the circuit board in place during the trimming operation.

In order to hold the circuit board down upon the steps of the longitudinal bars, and to hold the still loose components in place upon the circuit board, resilient material 54 is placed on top of the circuit board 44. This resilient material is preferably very light foam polymer composition material of resilient nature so that it can properly engage all the components to hold them in place. Plate 56 is placed over the resilient material 54 in order to hold it down. Plate 56 is engaged under brackets 58 and 60 which each have a leg under which the plate 56 engages and each have a downwardly extending upright leg which are respectively engaged under clamp screws 34 and 36. The upright legs of brackets 58 and 60 may be slotted so that the vertical position of the brackets may be adjusted for adjusting the load of plate 56 on resilient material 54. The plate and brackets are shown only in FIGS. 2 and 3 so as to leave the top view of the main structure fully apparent in the plan view of FIG. 1. Toggle clamp 62 is secured on end plate 18 and positioned so as to engage on the otherwise free end of plate 56. Toggle clamp 62 is shown in the open position in FIGS. 1 and 2. When it is brought downward, it engages the otherwise free end of plate 56 and places the proper load upon resilient material 54. Toggle clamp 62 is also adjustable.

Support post 64 is mounted upon the rear edge of base plate 14 and extends upwardly. It carries pivot 66 upon which link 68 is mounted. Arm 70 has a clamp 72 on its outer end. Furthermore, manual handle 74 is secured to the outer end of arm 70. Clamp 72 on arm 70 engages around motive means 76. As shown, motive means 76 is an air motor having an air inlet hose 78 which leads from air control structure 80. The amount of air passed by air control structure 80 determines the rotational speed of motive means 76. Motive means 76 has an output shaft 82 upon which cutter 84 is mounted. Motive means 76 is vertically adjustable within clamp 72 so that the positioning of cutter 84 can be adjusted with respect to the bottom of circuit board 44. Preferably, cutter 84 passes just below the bottom surface of the circuit board so that the wires upon the circuit board are cut off to a length which extends just out of the openings in the circuit board. This provides the most satisfactory dip soldering.

The support linkage of motive means 76 is such that the manual handle 74 can freely move the motive means over considerable area within frame 12. All axes are perpendicular to the plane defined by steps 40 and 42 so that the cutter is always equally spaced from the plane. However, it is undesirable for cutter 84 to engage upon longitudinal bars 26 and 28, and the cutter is positioned therebetween. Thus, guide bars 86 and 88 are mounted upon brackets 94 and 96 and brackets 90 and 92 respectively. Brackets 90 and 92 have slots therein and art clamped against end plates 18 and 20 in such a manner that the guide bar 88 may be appropriately moved to limit the motion of motive means 76 in the downward direction as seen in FIG. 1. Similarly, guide bar 86 is secured to brackets 94 and 96 so that the upwardly limit of travel is limited. Thus, the adjustable positions of guide bars 86 and 88 limit the cutter 84 so that it does not run into the sides of longitudinal bars 26 and 28. Furthermore, these guide bars provide economy of movement so that the cutter 84 only moves in a position wherein it is effective in cutting. Proper cutting is necessary, for the wires are ductile and soft. When cutter 84 is close to the circuit board, and the cut is thus close to the circuit board so that the wires are reasonably well supported, a properly sharpened and shaped carbide tipped cutter is satisfactory for cutting the wires. In some cases, however, it may be necessary to use a diamond wheel to provide proper cutting.

To set up the trimmer 10 for use, the widthwise dimention of the circuit board to be trimmed is established. Longitudinal bars 26 and 28 are set a proper widthwise dimension so that a circuit board 44 can rest upon the steps 40 and 42. Then, the cross bars 46 and 48 are put into position so as to limit the endwise motion of circuit board 44. Guide bars 86 and 88 are positioned so that cutter 84 can sweep the entire area which will have wires, but is prevented from contact with the longitudinal bars. If necessary, the height of the cutter is adjusted by moving motive means 76 vertically in clamp 72. Thereupon, the trimmer 10 is ready for use. A circuit board 44 is placed in the trimmer 10. The circuit board may have resilient material 54 already in association therewith so as to hold the components in place. In any event, after resilient material 54 is placed, plate 56 is positioned and clamp 62 is closed. Motive means 76 is started and manual actuation of handle 74 is used to move cutter 84 upon the described means holding it throughout the entire under area of circuit board 44 which has the wires protruding therefrom. Thereupon, all wires are cut to the proper length. When cutting is complete, clamp 62 is loosened, plate 56 is moved and the circuit board 44 is removed for its next step toward its completion. Successive circuit boards are trimmed in accordance with this method.

This invention having been described in its preferred embodiment, it is clear that it is susceptible to numerous modifications and embodiments within the skill of the routine artisan and without the exercise of the inventive faculty. Accordingly, the scope of this invention is defined by the scope of the following claims.

I claim:

1. A wire trimmer adapted to trim wires depending from a circuit board, said wire trimmer including:

a frame, support means for holding a circuit board on said frame, said support means being located on said frame and being adapted to hold a circuit board in a plane on said frame, holding means for holding a cutting means movably mounted on said frame so as to be capable of being freely moved with respect to said support means in a plane parallel to and spaced from the plane of said support means, a cutting wheel rotatably mounted on said holding means so as to be capable of being rotated about an axis perpendicular to said plane, and means for rotating said cutting wheel connected to said cutting wheel.

2. A wire trimmer as claimed in claim 1 wherein said holding means includes:

a post mounted on said frame, a link pivotally mounted on said post, an arm pivotally mounted on said link, and wherein said cutting wheel is rotatably mounted on said arm.

3. A wire trimmer as claimed in claim 1 wherein:

said cutting wheel is movably mounted with respect to said arm so as to be capable of being positioned in different positions with respect to said plane of said support means.

4. A wire trimmer as claimed in claim 1 including:

guide means positioned on said frame for limiting motion of said cutting wheel with respect to said frame.

References Cited

UNITED STATES PATENTS

| | | | |
|---|---|---|---|
| 600,888 | 3/1898 | Puchner et al. | 269—298 |
| 1,406,497 | 2/1922 | Rutledge | 83—471 |
| 2,512,164 | 6/1950 | Mann | 144—2 |
| 3,307,442 | 3/1967 | Imhoff | 83—925 X |

ANDREW R. JUHASZ, *Primary Examiner.*

U.S. Cl. X.R.

83—483, 648, 925